United States Patent [19]

Manako

[11] Patent Number: 5,759,971

[45] Date of Patent: Jun. 2, 1998

[54] SEMICONDUCTOR WAFER CLEANING LIQUID

[75] Inventor: Kazuyoshi Manako, Saga, Japan

[73] Assignee: Sumitomo Sitix Corporation, Hyogo-ken, Japan

[21] Appl. No.: 509,222

[22] Filed: Jul. 31, 1995

[30] Foreign Application Priority Data

Jul. 29, 1994 [JP] Japan ................... 6-179239

[51] Int. Cl.$^6$ ............... C11D 7/08; C11D 7/18; B08B 3/08
[52] U.S. Cl. ........................... 510/175; 134/3
[58] Field of Search ..................... 510/175, 406, 510/505, 257; 134/2, 3

[56] References Cited

U.S. PATENT DOCUMENTS

| | | | |
|---|---|---|---|
| 5,180,469 | 1/1993 | Abe | 156/653 |
| 5,261,966 | 11/1993 | Mashimo et al. | 134/2 |
| 5,423,944 | 6/1995 | Wong | 134/646.1 |
| 5,489,557 | 2/1996 | Jolley | 134/3 X |
| 5,494,849 | 2/1996 | Iyer et al. | 437/63 |
| 5,516,730 | 5/1996 | Saeed et al. | 134/2 X |
| 5,567,244 | 10/1996 | Lee et al. | 134/3 |
| 5,589,422 | 12/1996 | Bhat | 437/228 |
| 5,601,656 | 2/1997 | Li | 134/2 |
| 5,603,849 | 2/1997 | Li | 216/99 |
| 5,626,681 | 5/1997 | Nakano et al. | 134/3 |
| 5,665,168 | 9/1997 | Nakano et al. | 134/2 |

FOREIGN PATENT DOCUMENTS

| | | |
|---|---|---|
| 4144131 | 5/1992 | Japan |
| 4367593 | 12/1992 | Japan |
| 5243195 | 9/1993 | Japan |
| 7297163 | 11/1995 | Japan |

OTHER PUBLICATIONS

Donohue, J.A., et al., "Gas Chromatographic Determination of Ozone and Other Products from the Electrolysis of Wet Hydrogen Fluoride", Analytical Chemistry, 38(13), 1858–1860, Dec. 1966.

Wong, M., et al., "Silicon Etch Using Vapor Phas HF/H2O and O3", Journal of the Electrochemical Society, 140(2), 567–570, Feb. 1993.

Foller, Peter C., et al., "The Anodic Evolution of Ozone", Journal of the Electrochemical Society, 129(3), 506–515, Mar. 1992.

Kirk–Othmer, Encyclopedia of Chemical Technology, 3rd ed., vol. 10, pp. 733–753. (Month unknown.), 1980.

Primary Examiner—Douglas J. McGinty
Attorney, Agent, or Firm—Kanesaka & Takeuchi

[57] ABSTRACT

A semiconductor wafer cleaning liquid includes an aqueous hydrogen fluoride (HF) solution having a HF concentration between 0.03% and 0.05% by weight, which is adjusted to 20° C. or below and into which ozone is directly dissolved up to a saturation point. A method for cleaning semiconductor wafers incudes the steps of charging an aqueous HF solution adjusted to 20° C. or below and having an HF concentration between 0.03% and 0.05% by weight into a treatment bath; dissolving ozone into the aqueous solution up to a saturation point to prepare a cleaning liquid; dipping to etch semiconductor substrate into the cleaning liquid in the treatment bath; and rinsing the semiconductor substrate with pure or ozone-dissolved water in a bath separate from the treatment bath.

1 Claim, 7 Drawing Sheets

SEMICONDUCTOR WAFER CLEANING LIQUID

BACKGROUND OF THE INVENTION

1. Field of the Invention

This invention relates to a removal of impurities from semiconductor substrate, and particularly to a cleaning liquid for removing metal components and particles, and to a method for cleaning semiconductor wafers with this cleaning liquid.

2. Description of the Prior Art

To remove impurities from semiconductor wafers, so called wet cleaning which uses a cleaning liquid is mainly used. The cleaning effects are variable depending on kinds of impurities, so that various kinds of cleaning methods are used nowadays.

More specifically, to remove particles, a standard cleaning-1 (hereinafter "SC-1") is made by using alkaline chemicals, namely a chemical liquid mainly containing $NH_4OH$, $H_2O_2$ and $H_2O$. This liquid etches a semiconductor substrate to remove particles from its surface. But, the SC-1 has a poor effect on removing ability of metal exception some elements, and an acid cleaning is then performed in addition.

The acid cleaning is known as a standard cleaning-2 (hereinafter "SC-2") which uses a chemical liquid mainly containing HCl, $H_2O_2$ and $H_2O$. This cleaning method ionizes metal to remove it, but has difficulty in removing elements such as Al which are easily oxidized and exist as stable oxides within a natural oxide film formed on silicon.

To remove a natural oxide film, a cleaning method with diluted hydrofluoric acid (hereinafter "DHF cleaning") which uses a solution having hydrofluoric acid diluted with $H_2O$ is used. The DHF cleaning is effective to remove metal from an oxide film, but not effective to remove Cu and others which are directly adsorbed to a wafer. The wafer undergone this cleaning has a hydrophobic surface which is easily contaminated with particles.

As examples of cleaning methods to remedy the above problems, (1) $DHF/H_2O_2$ method and (2) DHF/ozone method have been proposed.

The method (1) has an advantage of enabling a removal of Al and Cu with a simultaneous method of etching with HF and oxidizing with $H_2O_2$. And, this cleaning method has a better effect of preventing particles from adhering than the diluted hydrofluoric acid cleaning, but this effect is most preferably attained when the wafer surface has a hydrophilic condition (a contact angle of below 5°) at the same level as that when treated by the SC-1. To meet the above condition, the method (1) needs to keep $H_2O_2$ at a concentration of 10 odd percent or above when an aqueous HF solution has an HF concentration of 400 ppm and is at normal temperature. Consequently, this method has disadvantages that a large quantity of $H_2O_2$ is used, costing high, and metal impurities contained in an undiluted solution of $H_2O_2$ cannot be disregarded.

On the other hand, the method (2) can stably oxidize the surface of a semiconductor wafer because use of ozone instead of a large quantity of $H_2O_2$ allows to set an oxidization rate at quite a high level qualitatively. Thus, the method (2) is basically better than the method (1). In reality, however, no appropriate method has been proposed because specific conditions under which the semiconductor wafer surface can be oxidized stably are various.

In view of above, this invention has considered an HF concentration capable of exerting a full ability to remove heavy metal and a relation between a cleaning liquid temperature and a contact angle, which is related to the HF concentration, and aims to provide a cleaning liquid suitable for removal of metal components and particles, and a method for cleaning semiconductor wafers with this cleaning liquid.

SUMMARY OF THE INVENTION

To accomplish the above objects, this invention provides a cleaning liquid for semiconductor substrate, which has ozone dissolved up to a saturation point into an aqueous HF solution having an HF concentration between 0.03% and 0.05% by weight and which is adjusted to 20° C. or below.

Further, this invention relates to a method for cleaning semiconductor wafers comprising charging an aqueous solution adjusted to 20° C. or below and having an HF concentration between 0.03% and 0.05% by weight into a treatment bath and dissolving ozone up to a saturation point into the above aqueous solution to prepare a cleaning liquid, dipping to etch a semiconductor substrate into the cleaning liquid in the treatment bath, and feeding pure water or ozone-dissolved water to rinse the semiconductor substrate. In this case, the substrate is basically rinsed in another bath, but it may be rinsed in the treatment bath, and then in another bath.

The principle of the invention will be described hereinafter.

Figure 1:
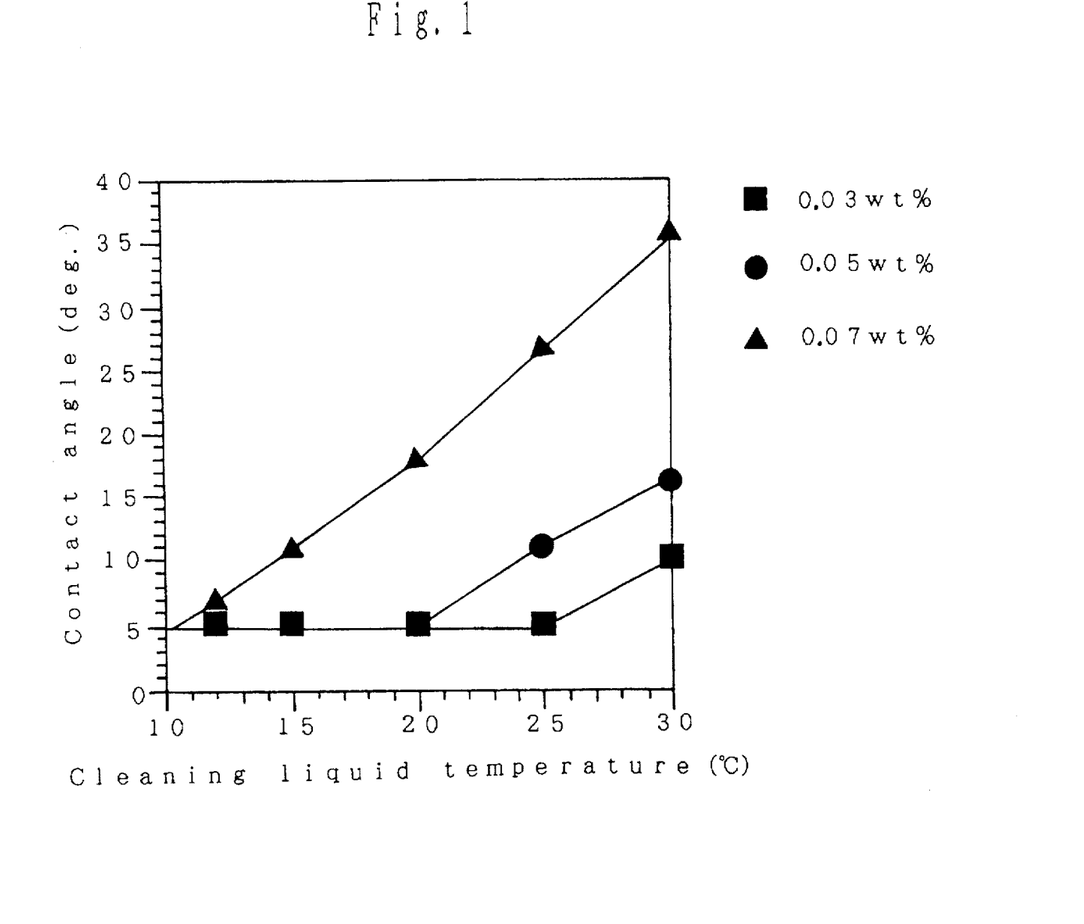
FIG. 1 is a graph showing the relation between a cleaning liquid temperature and a contact angle by an HF concentration.

FIG. 1 shows a relation between a cleaning liquid temperature and a contact angle by an HF concentration. It is seen that hydrophilicity (a contact angle of below 5°) after cleaning is held up to a cleaning temperature of 25° C. when the HF concentration is 0.03% by weight which is required to remove heavy metal. When the HF concentration is 0.05% by weight, the contact angle begins to rise at about a cleaning temperature of 20° C. And, when the HF concentration becomes high to 0.07% by weight, the contact angle begins to increase even at a cleaning temperature of 12° C.

It is seen from the above that the cleaning temperature is required to be 10° C. or below to provide hydrophilicity for the surface cleaned in the cleaning liquid having an HF concentration of 0.07% by weight. But, when the cleaning liquid has a temperature of 10° C. or below, the etching ability of HF is lowered with respect to $SiO_2$, resulting in degrading detergency of the cleaning liquid.

From the viewpoint of dissolution efficiency of ozone gas, the cleaning liquid temperature is required to be 20° C. or below. And, the HF concentration is required to be 0.05% by weight or below because a contact angle begins to increases when the liquid temperature is around 20° C. and the HF concentration is 0.05% by weight. As described above, the HF concentration is required to be 0.03% by weight to remove heavy metal, so that the HF concentration for efficient cleaning ability is between 0.03% and 0.05% by weight.

The dissolved $O_3$ concentration is generally proportional to an oxidation rate. Therefore, the oxidation rate is improved by directly dissolving ozone up to a saturation point. Here, the term "directly" means to dissolve ozone into the aqueous HF solution, and is in contrast to "indirectly" which indicates that ozone is dissolved into water, to which HF is then added. The "directly" is preferred to ozone because it easily dissolves into an acidic solution, while the "indirectly" is not preferred because the dissolved ozone may decompose to disappear when mixed with the aqueous HF solution to be added later.

This invention can remove a natural oxide film from the semiconductor surface with the etching action of HF, and metal impurities and particles from the surface and inside of the film as well. Besides, ozone gas dissolved in the aqueous HF solution works to newly form a natural oxide film, and additional etching with HF can remove metal and particle adsorbed to the proximity of the interface between the silicon bare surface and the natural oxide film.

When ozone is used as an oxidizing agent as in this invention, an oxidation rate can be set considerably higher than that of $H_2O_2$, so that the surface is stably oxidized, an oxide film of Si is uniformly formed on the cleaned surface, the cleaned surface can be stably kept in a hydrophilic condition (a contact angle of below 5°), and an effect of preventing particle from adhering again can be further enhanced. When an organic film is formed on the wafer surface during storage, a $DHF/H_2O_2$ liquid has a decreased etching rate or a lowered detergency because $H_2O_2$ does not have a sufficient oxidation rate. But, the cleaning liquid of this invention is not largely affected because the organic film is oxidatively decomposed by the powerful oxidation effect of ozone.

DETAILED DESCRIPTION OF THE PREFERRED EMBODIMENTS

Figure 2:
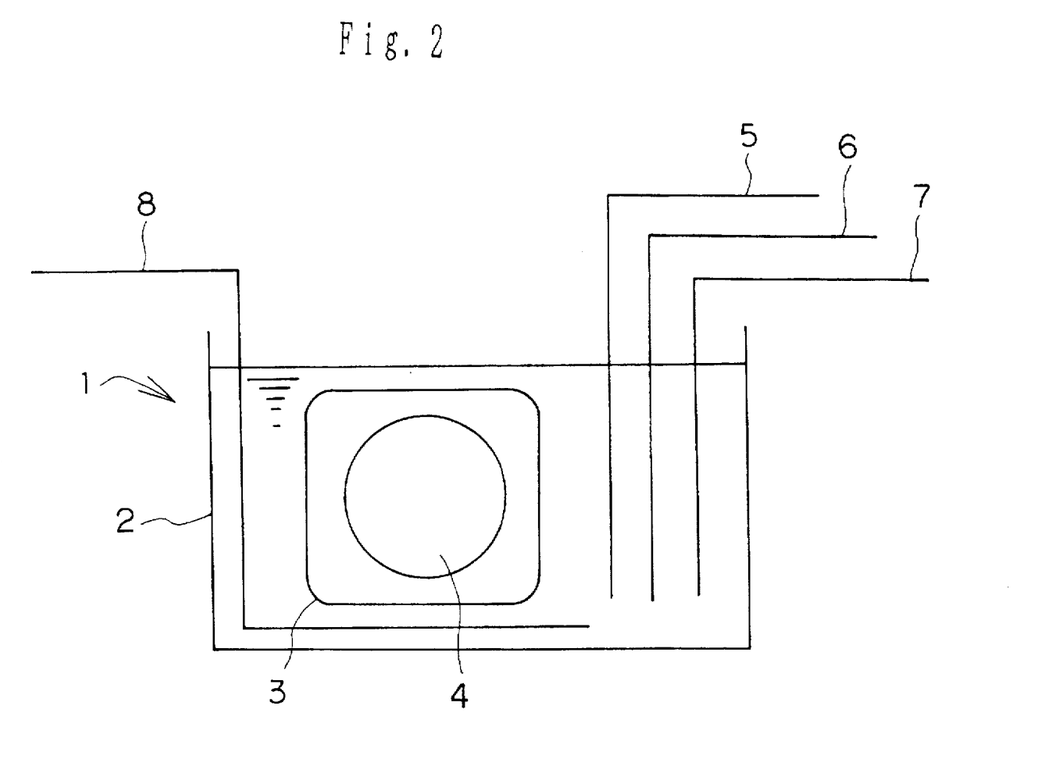
FIG. 2 is a diagram showing cleaning equipment for conducting this invention.

FIG. 2 shows cleaning equipment used to effect this invention. Cleaning equipment 1 of this embodiment has a treatment bath 2 provided with an openable top, a support (not shown) for supporting a carrier 3 at the center of the bottom in the treatment bath 2, and a plurality of wafers 4 to be cleaned accommodated within the carrier 3. Above the treatment bath 2 are disposed a pure water feeding pipe 5 for supplying pure water into the treatment bath 2, a hydrofluoric acid feeding pipe 6 for supplying hydrofluoric acid, and a rinsing liquid feeding pipe 7 for continuously supplying pure water or ozone-dissolved water when rinsing. These pipes are connected to supply sources via valves (not shown). The treatment bath 2 is also provided with an ozone feeding pipe 8 which is connected to an ozone feeder (not shown).

Figure 3:
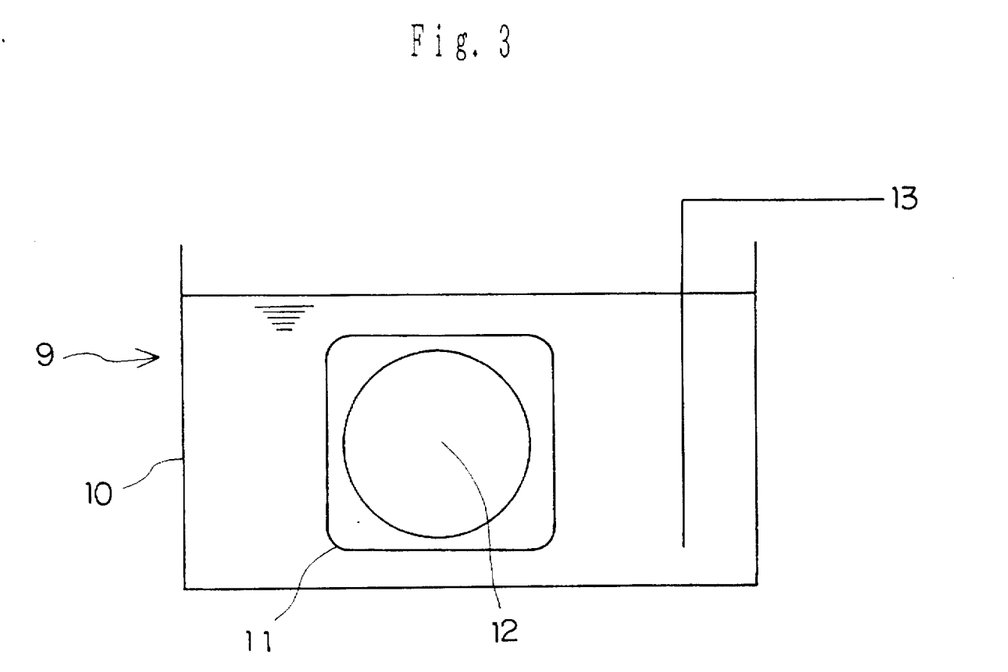
FIG. 3 is a diagram showing rinsing equipment for conducting this invention.

FIG. 3 shows rinse equipment used to effect this invention. Rinse equipment 9 of this embodiment is used to rinse wafers after the cleaning treatment in the cleaning equipment 1. It has a rinse bath 10 provided with an openable top, a support (not shown) for supporting a carrier 11 at the center of the bottom in the rinse bath 10, and a plurality of wafers 12 to be cleaned accommodated within the carrier 11. Above the rinse bath 10 is disposed a pipe 13 from a pure water feeder or an ozone-dissolved water producing device (not shown).

To remove impurities from the surface of a semiconductor substrate, it is effective to etch the natural oxide film and the proximity of the interface between the film and the bare surface of the substrate. In this case, an etching quantity of 15 angstroms or more is required in total. On the other hand, factors, on which the etching quantity with the cleaning liquid of the invention depends, include an HF concentration, a dissolved $O_3$ concentration, a treating liquid temperature and a treating time. And, these factors are required to be controlled to attain a stable effect. The etching ability of HF depends on its concentration and a treating liquid temperature, and the oxidation with ozone on its dissolved concentration. The dissolved concentration complies with Henry's Law, but ozone is dissolved into an acidic solution having a low pH value.

In this embodiment, the aqueous solution of HF, an etching acid, was adjusted to have an HF concentration between 0.03% and 0.05% by weight and at a temperature of 15° C. in the cleaning equipment, and ozone gas was dissolved up to a saturation point into the above solution to prepare a treating liquid (hereinafter "$DHF/O_3$ liquid"), which is used for evaluation. As shown in FIG. 3, evaluation was made by rinsing (Ex. 1) in the rinse bath 10, separate from the treatment bath 2, with pure water or ozone-dissolved water supplied therein, and by previously rinsing (Ex. 2) in the treatment bath 2 pure water or ozone-dissolved water supplied therein and then rinsing in the rinse bath 10, separate from the treatment bath 2, with pure water or ozone-dissolved water supplied therein.

Figure 4:
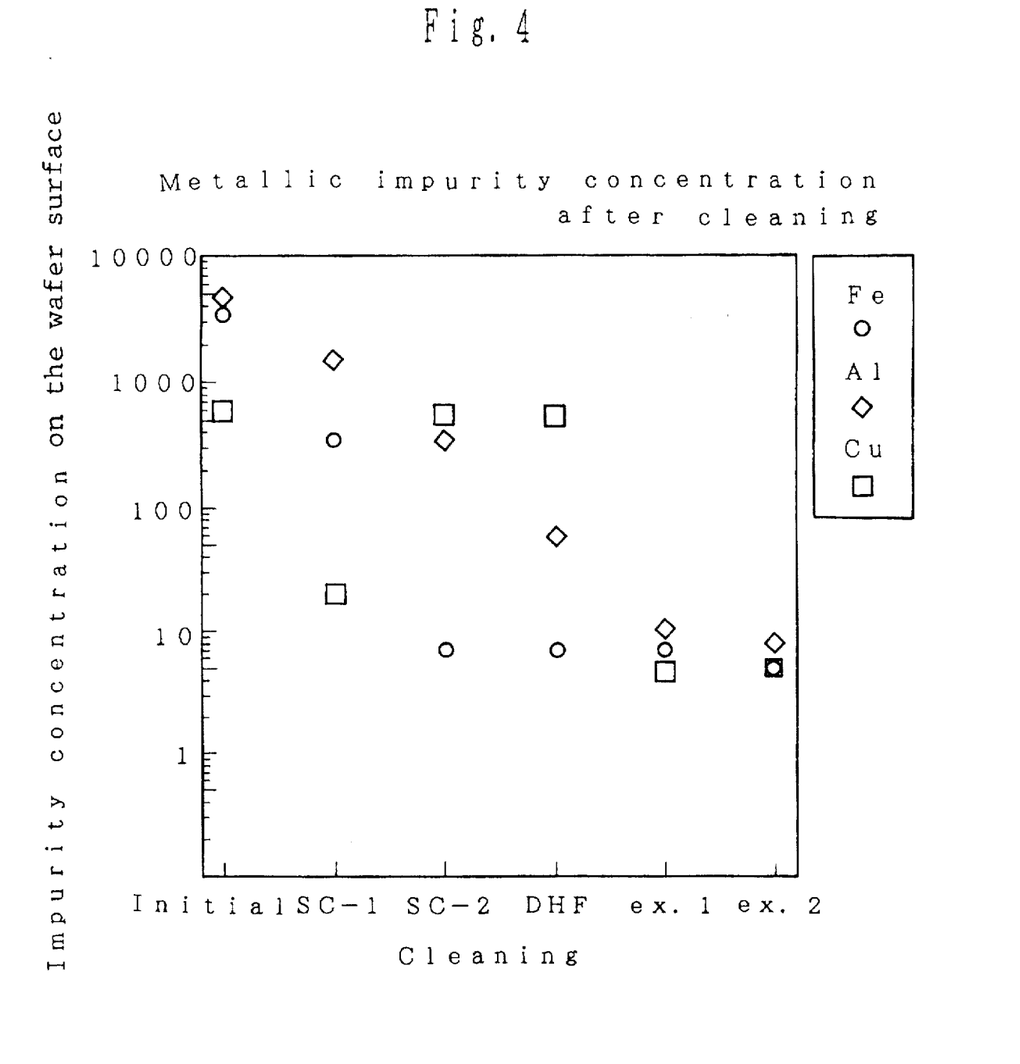
FIG. 4 is a graph showing the ability to remove metal impurities of various cleaning liquids.

FIG. 4 is a graph showing the ability to remove metal impurities of various cleaning liquids. The abilities to remove metal impurities were compared by cleaning contaminated wafers with various types of cleaning liquids and the $DHF/O_3$ liquid of the invention. It is seen from FIG. 4 that the SC-1 is inferior in removing Al and Fe, the SC-2 is inferior in removing Al and Cu, and the DHF cleaning is inferior in removing Cu.

On the other hand, it was confirmed that the cleaning methods (Ex. 1 and Ex. 2) of this embodiment had a sufficient effect of removing Al and Cu. The additional rinsing in the rinse bath 10 with ozone-dissolved water after substitution rinsing in the treatment bath 2 (Ex. 2) can prevent metal impurities and particles from adhering and also can stabilize the wafer surface condition.

Figure 5:
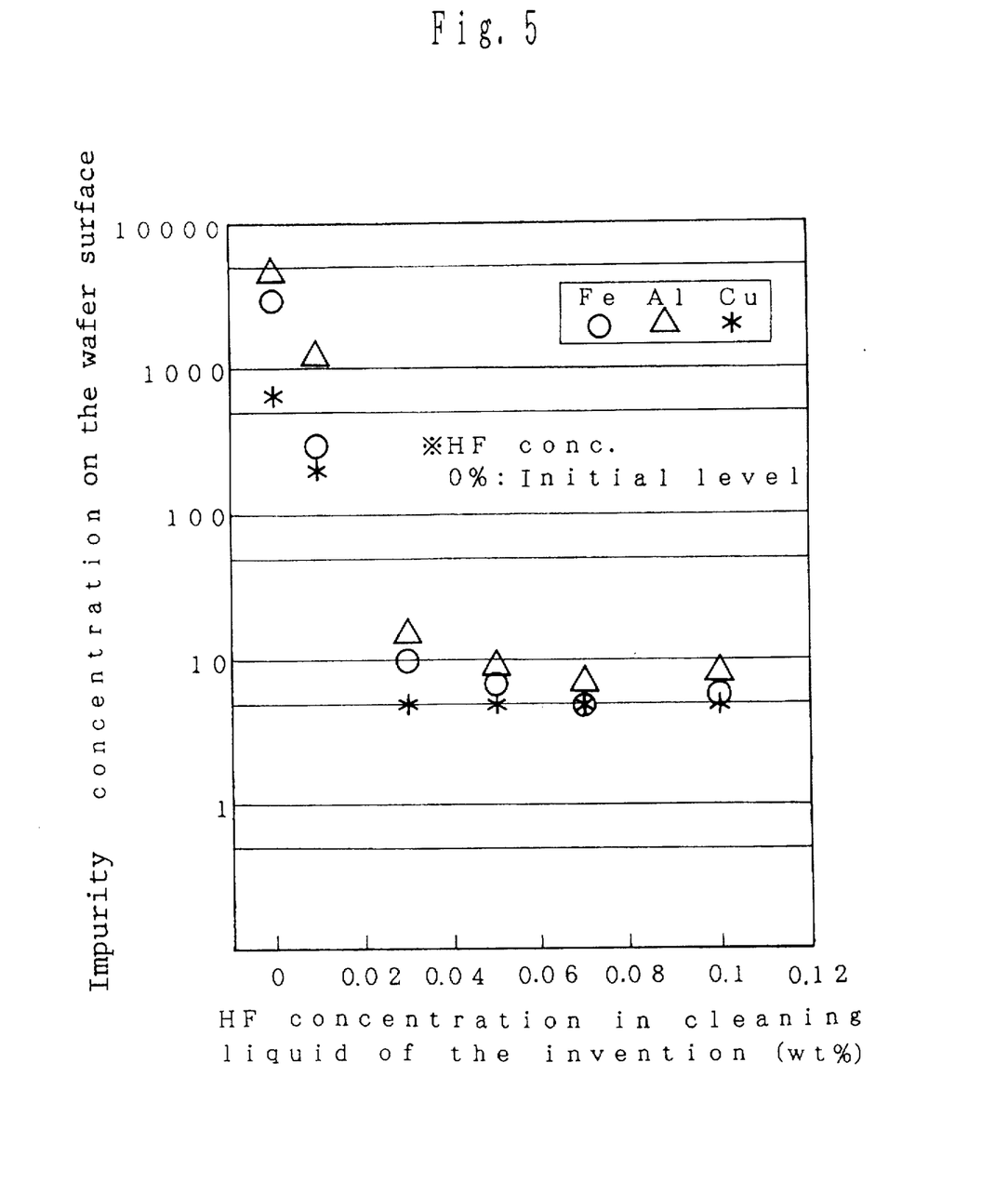
FIG. 5 is a graph showing an effect of an HF concentration in the cleaning liquid of this embodiment of the removability of metal.

FIG. 5 is a graph showing an effect of an HF concentration in the cleaning liquid of this embodiment on the removability of metal. The HF concentration of 0.03% by weight or above allows a sufficient metal removing effect of two digits or more.

As to the particle removing ability, when a wafer is treated with the DHF cleaning in a concentration range effective for removal of metal for 10 minutes, the water has a hydrophobic surface and attracts particles very easily because the natural oxide film is removed. Thus, the treated surface is required to be hydrophilic, so that this embodiment dissolves ozone gas into an aqueous DHF solution to provide the treating liquid with a powerful oxidizing ability. To keep the treated water surface in a hydrophilic condition, the dissolved ozone concentration is required to be 20 ppm or above when the HF concentration is less than 20 ppm, the HF etching ability excels the oxidization rate of ozone, and the treated wafer surface becomes hydrophobic. After treating the wafer in the treatment bath 2, the rinsing in the rinse bath 10 independent from the treatment bath 2 (Ex. 1) can oxidatively decompose organic substances on the wafer surface and also can uniformly stabilize the hydrophilicity of the surface.

Figure 6:
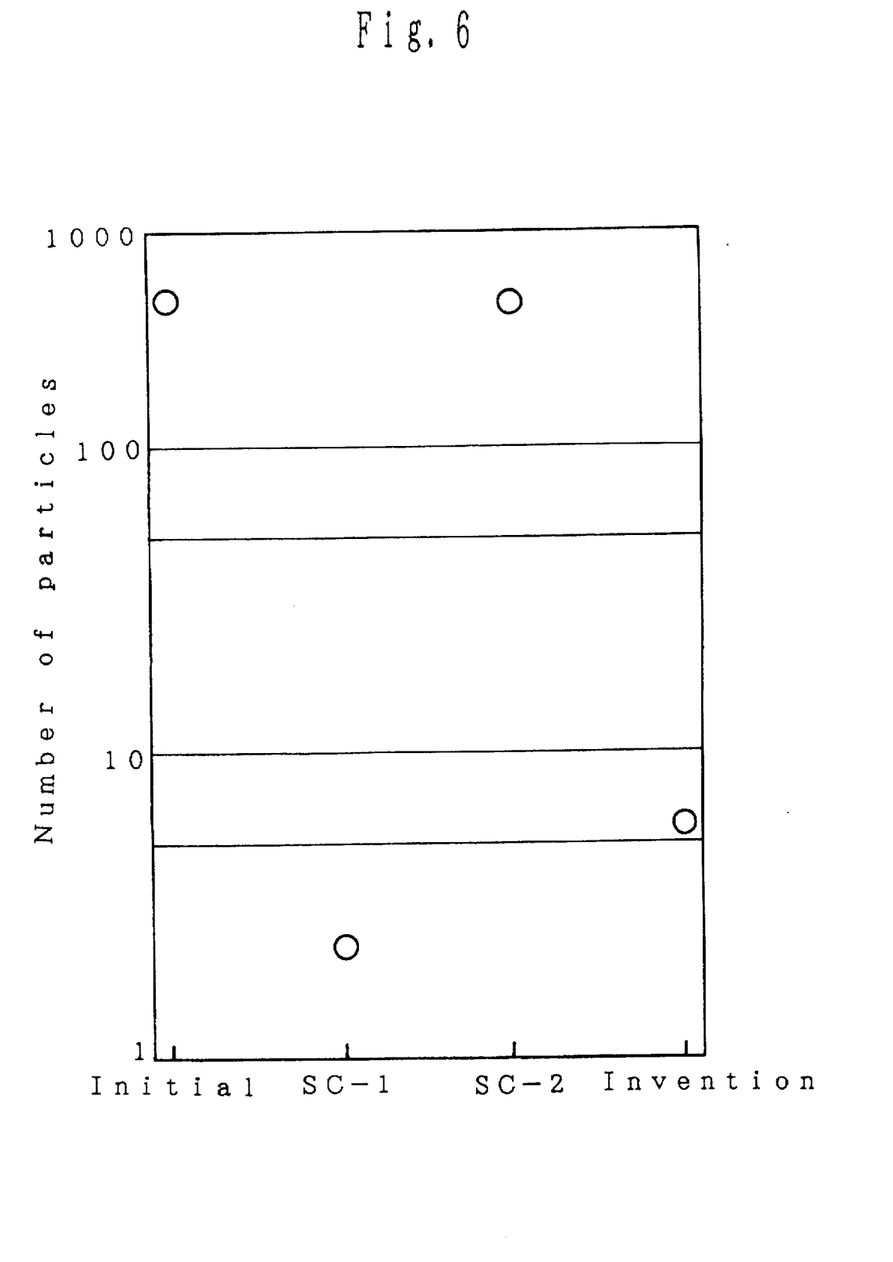
FIG. 6 is a graph showing the number of particles after the treatment with various cleaning liquids.

FIG. 6 shows the particle removing rates of the SC-1, the SC-2 and the DHF/$O_3$ liquid cleaning. The SC-2 has no removing effect, while the cleaning liquid of this embodiment has a removing ability similar to that of the SC-1.

The treating liquid is very clean because the HF concentration therein is low and the oxidizing agent, ozone, is supplied in the form of gas. The etching rate of the treating liquid can be varied by adjusting the HF concentration, but it is also influenced by the oxidation due to the ozone gas. Therefore, it is important to control the dissolved $O_3$ concentration. Furthermore, since the etching with the HF and the oxidation with the ozone depend on the treating liquid temperature, controlling of the treating liquid temperature allows the adjustment of the balance of these actions. The treating liquid is required to be adjusted at 20° C. or below from the viewpoint of the dissolution efficiency of the ozone gas.

Figure 7:
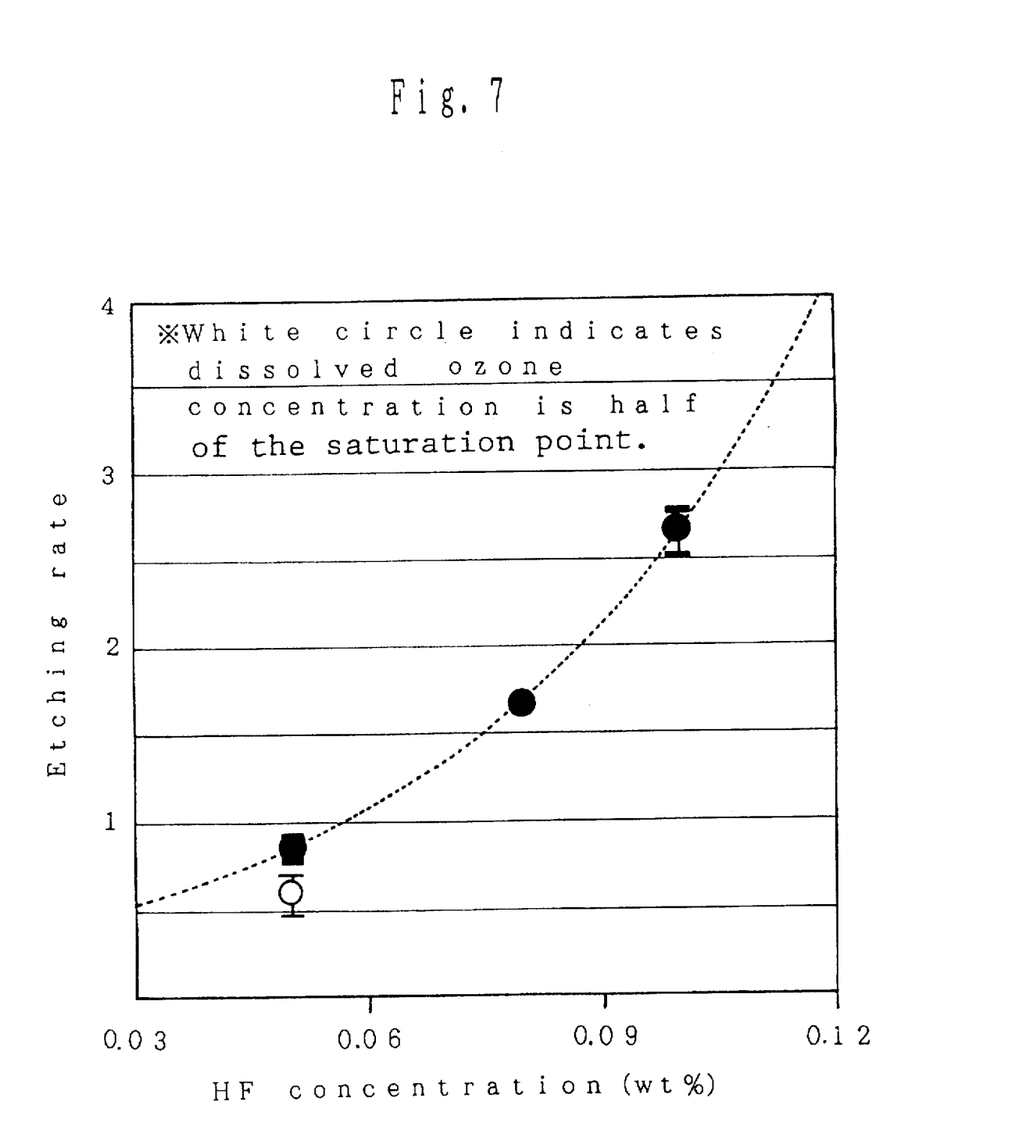
FIG. 7 is a graph showing a wafer etching rate of the cleaning liquid of this embodiment.

FIG. 7 shows a wafer etching rate by the cleaning method of this embodiment. In the drawing, the white circle indicates an etching rate of the treating liquid having HF concentration of 0.05% by weight and with a dissolved $O_3$ concentration adjusted to about a half of the saturation point.

The cleaning method of this embodiment can control the etching rate by adjusting the HF concentration and the dissolved $O_3$ concentration. But, increasing the etching rate leads to a shortage of the oxidization rate of the liquid, resulting in poor wettability of the wafer surface and a lowered particle adhesion preventing effect.

After cleaning the wafer in the treatment bath, substitution rinsing with ozone-dissolved water supplied to the treatment bath can prevent particles from adhering and metal impurities from cross contaminating. This method gradually substitutes the bath content with ozone water to form an oxide film on the bare surface due to ozone before the removed metal impurities cross contaminate the bare surface, and cleaning can be made stably. After the treatment, pH is close to neutral and a zeta potential is lowered, so that particles can be prevented from adhering, and cleaning can be made stably.

This embodiment can also be applied when an organic film is formed on the wafer surface due to stays before treating.

As described above, this invention uses an aqueous HF solution having an HF concentration of 0.03% by weight or more and, therefore, has an HF concentration required at the minimum to remove heavy metal; the aqueous HF solution has an HF concentration of up to 0.05% by weight and is adjusted to 20° C. or below. Thus, the cleaning liquid for semiconductor substrate can hold hydrophilicity (a contact angle of below 5°), can dissolve ozone up to a saturation point, and can dissolve ozone so that it is fully dissolved. And, powerful oxidation action with ozone can be expected.

The cleaning liquid and the cleaning method of the invention can remove a natural oxide film from the semiconductor surface as well as metal impurities and particles from the surface and inside of the film by the etching action of HF. Besides, ozone gas dissolved into the aqueous HF etching can also remove metal and particles being adsorbed to the interface between the silicon bare surface and the natural oxide film.

Thus, the cleaning method of the invention can remove metal from the inside of the natural oxide film and the proximity of the interface between the film and the bare surface of the substrate by oxidizing and etching actions, and exerts sufficient cleaning to remove elements which cannot be removed or fully removed by the SC-2 or the DHF cleaning. Furthermore, this method exerts various effects that particles can be removed even if this is an acid cleaning and its cleaning effect is similar to that of the SC-1.

What is claimed is:

1. A semiconductor wafer cleaning liquid consisting essential of an aqueous solution of hydrofluoric acid (HF) having a HF concentration between 0.03% and 0.05% by weight and ozone directly dissolved into said aqueous solution at a saturation point at a temperature between 10° and 20° C.

* * * * *